United States Patent
Fletcher et al.

(10) Patent No.: US 9,651,862 B2
(45) Date of Patent: May 16, 2017

(54) DROP PATTERN GENERATION FOR IMPRINT LITHOGRAPHY WITH DIRECTIONALLY-PATTERNED TEMPLATES

(71) Applicants: Canon Nanotechnologies, Inc., Austin, TX (US); Toshiba Corporation, Tokyo (JP)

(72) Inventors: Edward Brian Fletcher, Austin, TX (US); Gerard M. Schmid, Albany, NY (US); Se-Hyuk Im, Austin, TX (US); Niyaz Khusnatdinov, Round Rock, TX (US); Yeshwanth Srinivasan, Austin, TX (US); Weijun Liu, Cedar Park, TX (US); Frank Y. Xu, Round Rock, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 130 days.

(21) Appl. No.: 14/329,381

(22) Filed: Jul. 11, 2014

(65) Prior Publication Data
US 2015/0017329 A1  Jan. 15, 2015

Related U.S. Application Data

(60) Provisional application No. 61/845,500, filed on Jul. 12, 2013.

(51) Int. Cl.
*G03F 7/00* (2006.01)
*B29C 43/02* (2006.01)
(Continued)

(52) U.S. Cl.
CPC .......... *G03F 7/0002* (2013.01); *B29C 43/021* (2013.01); *B29C 43/18* (2013.01);
(Continued)

(58) Field of Classification Search
None
See application file for complete search history.

(56) References Cited

U.S. PATENT DOCUMENTS 6,873,087 B1  3/2005  Choi et al.
6,932,934 B2  8/2005  Choi et al.
(Continued)

FOREIGN PATENT DOCUMENTS

JP  WO 2011122702 A1 * 10/2011 ............ B41J 2/2135
JP  WO 2012002301 A1 *  1/2012 .......... B41J 2/04508
(Continued)

OTHER PUBLICATIONS

International Search Report for PCT/US2014/046357, European Patent Office, 2014-110-16.

*Primary Examiner* — Michael P Rodriguez
(74) *Attorney, Agent, or Firm* — Cameron A. King

(57) ABSTRACT

Imprint lithography methods that incorporate depositing droplets of polymerizable material in patterns that improve fill time performance when employing directionally-oriented imprint templates. The patterns are based on grid arrays formed of repeating sets of rows of droplets oriented along fast and slow axes, with droplets of each row offset along the slow axis relative to droplets in adjacent rows.

19 Claims, 6 Drawing Sheets

(51) Int. Cl.
    *B29C 43/18*     (2006.01)
    *B29K 105/00*     (2006.01)
    *B29L 31/00*     (2006.01)
    *B05D 3/06*     (2006.01)
    *B05D 3/12*     (2006.01)

(52) U.S. Cl.
    CPC ............... *B05D 3/067* (2013.01); *B05D 3/12* (2013.01); *B29C 2043/025* (2013.01); *B29K 2105/0002* (2013.01); *B29K 2105/0058* (2013.01); *B29L 2031/7562* (2013.01)

(56) References Cited

U.S. PATENT DOCUMENTS

| | | | |
|---|---|---|---|
| 6,936,194 B2 | 8/2005 | Watts | |
| 7,077,992 B2 | 7/2006 | Sreenivasan et al. | |
| 7,157,036 B2 | 1/2007 | Choi et al. | |
| 7,179,396 B2 | 2/2007 | Sreenivasan | |
| 7,396,475 B2 | 7/2008 | Sreenivasan | |
| 8,076,386 B2 | 12/2011 | Xu et al. | |
| 8,119,052 B2 | 2/2012 | Schumaker | |
| 8,349,241 B2 | 1/2013 | Sreenivasan et al. | |
| 8,586,126 B2 | 11/2013 | Schumaker | |
| 2004/0065252 A1 | 4/2004 | Sreenivasan et al. | |
| 2005/0098534 A1* | 5/2005 | Sreenivasan | B82Y 10/00 216/52 |
| 2005/0106321 A1 | 5/2005 | McMackin et al. | |
| 2007/0237886 A1* | 10/2007 | Dijksman | B41J 3/4071 427/8 |
| 2008/0018875 A1 | 1/2008 | Schram et al. | |
| 2009/0148619 A1* | 6/2009 | LaBrake | B82Y 10/00 427/511 |
| 2010/0098847 A1 | 4/2010 | Truskett | |
| 2010/0120251 A1* | 5/2010 | Sreenivasan | B82Y 10/00 438/694 |
| 2013/0020281 A1 | 1/2013 | Wakamatsu et al. | |
| 2013/0120485 A1* | 5/2013 | Kodama | B41J 2/04508 347/14 |

FOREIGN PATENT DOCUMENTS

| | | |
|---|---|---|
| WO | WO2011/122702 A1 | 10/2011 |
| WO | WO2013/129679 A1 | 9/2013 |

* cited by examiner

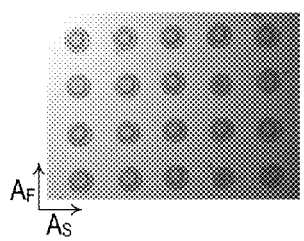 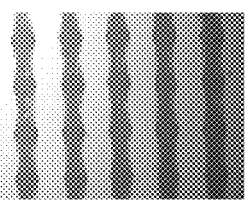 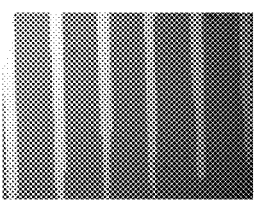 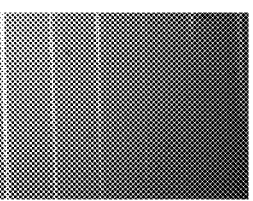
*FIG. 8A*  *FIG. 8B*  *FIG. 8C*  *FIG. 8D*
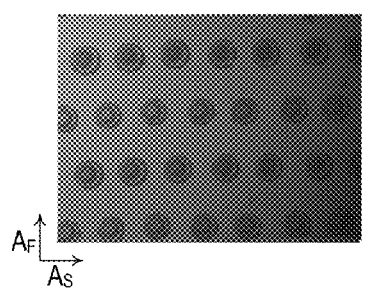 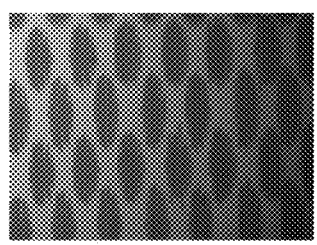 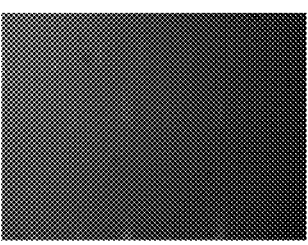
*FIG. 9A*  *FIG. 9B*  *FIG. 9C*
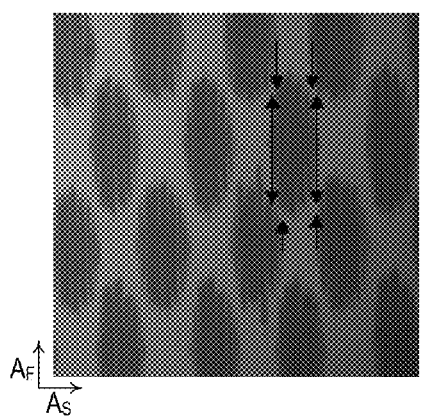
*FIG. 10*

DROP PATTERN GENERATION FOR IMPRINT LITHOGRAPHY WITH DIRECTIONALLY-PATTERNED TEMPLATES

CROSS-REFERENCE TO RELATED APPLICATION

This application claims the benefit under 35 U.S.C. §119 (e)(1) of U.S. Provisional Application No. 61/845,500 filed Jul. 12, 2013; which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include photovoltaic cells, biotechnology, optical technology, mechanical systems, and the like.

An exemplary nano-fabrication technique in use today is commonly referred to as imprint lithography. Imprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Imprint lithography is also useful in fabricating layers in a thin film head device for hard disks. Imprint lithography can also be used to fabricate patterned media for hard disk drives, optical devices such as polarizers for displays, photonic crystal structures, light trapping structures and filters for photovoltaic devices, nanostructures for battery electrodes, quantum dot structures for enhanced photonic and photovoltaic devices, biomedical devices, sensors, and in the fabrication of controlled nano-particles. Controlled nano-particles can be used to fabricate crystalline semiconducting materials, or as polymer-based drug carriers, among other uses. Exemplary imprint lithography processes are described in detail in numerous publications, such as U.S. Pat. Nos. 8,349,241 and 6,936,194, and U.S. Patent Publication No. 2004/0065252, all of which are hereby incorporated by reference herein.

An imprint lithography technique disclosed in each of the aforementioned U.S. patent publication and patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIGS. 8A-8D depict images showing a conventional square grid drop pattern and subsequent fluid spread upon contact with a directionally-patterned template.

FIGS. 9A-9C depict images showing an exemplary drop pattern and subsequent fluid spread upon contact with a directionally-patterned template.

FIG. 10 depicts an enlarged view of the fluid spread depicted in FIG. 9B.

DETAILED DESCRIPTION

Figure 1:
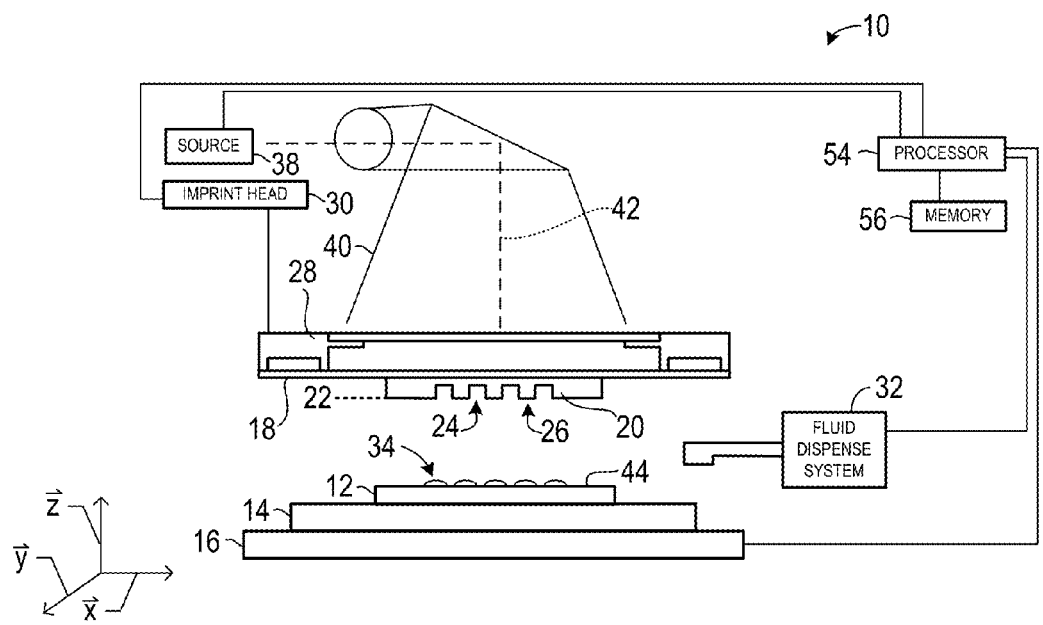
FIG. 1 illustrates a simplified side view of an exemplary imprint lithography system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Pat. No. 8,076,386, both of which are herein incorporated by reference. Alternatively, formable material 34 may include, but is not limited to, biomaterials (e.g., PEG), solar cell materials (e.g., N-type, P-type materials), and/or the like.

Figure 2:
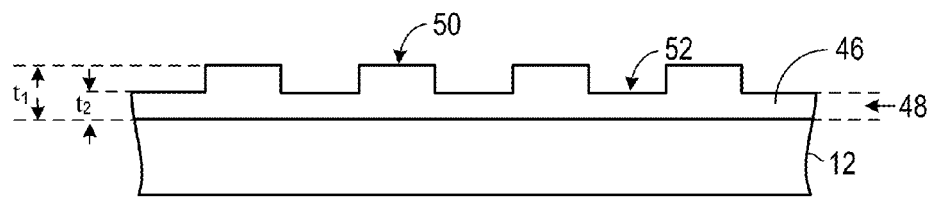
FIG. 2 illustrates a simplified side view of the substrate illustrated in FIG. 1, having a patterned layer with nano-structures thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

High throughput is important in the commercial adaptation of imprint lithography processes. When employing a drop dispense method of applying the polymerizable material to the substrate, the imprint process cycle generally consists of (1) dispensing (or depositing) droplets of liquid polymerizable material onto a substrate surface, (2) bringing a template into contact with these liquid droplets such that the liquid completely spreads and fills the topography of the template patterning surface, (3) solidifying (e.g. photocuring) the liquid, and (4) separating the template from the substrate, leaving solidified layer of the polymerized material having a relief image of the template pattern on the substrate surface. A major contributor to the imprint cycle time, and thus throughput, is the filling time, i.e., the time period associated with the spreading and filling of the template pattern features with the liquid polymeric material. Reducing filling time is thus important for increasing throughput in high-volume manufacturing processes. Methods and systems for reducing filling time are presented herein.

With regard to dispensing step (1) as generally described above, the liquid droplets of polymerizable material (or "resist", as further used herein) are dispensed to create a pattern of drops on the substrate surface. The drop layout can be computed such that the total volume of the liquid droplets on the surface matches the total volume of the desired resist pattern. As well as matching the total volume requirements of the desired resist pattern, it is further advantageous to match the local volume requirements of the desired resist pattern. Thus, a greater volume of liquid is dispensed in a region of the substrate where a greater volume of resist pattern is desired. Drop pattern generation methods that achieve the foregoing are described, for example, in U.S. Pat. Nos. 8,119,052 and 8,586,126, each of which is incorporated herein by reference.

Available inkjet systems, such as described, for example, in U.S. Patent Publication No. U.S. 2010/0098847, likewise incorporated herein by reference, can be tuned to dispense resist droplets with volumes in the range of 0.1 to 10 picoliters (pL), with 2 pL being an exemplary drop volume. In a typical resist drop pattern, a 2 pL droplet of resist occupies approximately 40,000 square microns of the substrate surface. A drop pattern layout for this pattern might consist of 1 droplet for every 40,000 square microns. For example, one drop pattern layout that matches this droplet density specification is a square grid array of droplets with a pitch of 200 microns. Another drop pattern layout that matches this droplet density specification is a rectangular grid that has a pitch of 50 microns in one direction and a pitch of 400 microns in a perpendicular direction.

However, it has been discovered that the directionality of patterns and pattern features of a template greatly influences the dynamics and directionality of the fluid spread process. For example, a directional pattern, such as a line/space grating array, can induce fluid to spread far more quickly along the axis of the grating relative to the direction perpendicular to such axis. This resultant anisotropic spread of fluid becomes an important consideration in design of a drop pattern layout for use with directionally-patterned templates. Provided herein are methods of generating drop patterns for use with directionally-patterned templates. Dramatic improvements in filling time were demonstrated using such methods. As used herein "directionally-patterned templates" refer to templates having at least a portion of their patterning surface having repeating elongated features that are oriented parallel to an axis ($A_T$) of the template, with the elongated features at least 10 times greater in length relative to their width and more preferably at least 10, 100, 1,000 or even 10,000 or more times greater in length relative to their width. Templates having gratings (i.e., repeating lines and spaces of a specific pitch) are illustrative of directionally-patterned templates but one of skill in the art will understand that the features of directionally-patterned templates as defined herein are not limited to gratings but include a variety of feature patterns including but not limited to line segments and the like. For example, as is further described in the examples provided herein, when using a template with gratings having a 32 nm line/space design, previous drop generation methods produced local filling times as observed by microscope ranging from 5 to 7 seconds or more. Using the drop patterns generated according to method provided herein, the same region could be filled in less than two seconds.

As noted above, directionally-patterned templates create anisotropic spreading of fluid, with fluid flowing and easier and faster along the direction of the directional pattern features, i.e., the fast axis (or $A_F$) which is parallel to $A_T$ and much slower in the direction that is orthogonal or perpendicular to the directional features, i.e., the slow axis (or $A_S$). As a result, such templates when used with non-uniform drop patterns have a tendency to produce high incidences of localized unfilled "slow spots" or interstitial voids or channels that take longer than desirable to completely fill. Uniform grid patterns can yield some improvement but still produce undesirable voids or channels that impact fill time. Methods provided herein address such anisotropic spread behavior through the use of grid drop patterns having repeating sets of offset (or staggered) rows of droplets. Importantly, these drop patterns further take into consideration the starting drop diameter (or DD), i.e., the diameter of the deposited droplet on the substrate prior to template contact. For a given resist and given substrate surface, the drop diameter can be empirically determined. By contrast, conventional drop generation methods do not utilize drop diameter as an input variable. The drop diameter (DD) is an important design input for directionally-oriented template patterns; by incorporating the starting drop diameter (DD) as a factor in drop pattern generation, significant improvements in filling time of directionally-oriented templates were obtained.

The number of rows in each repeating set can vary such that for any given pattern the repeating set can include n rows. Thus while patterns having repeating sets of two or three rows are exemplified herein, other patterns with repeating sets of rows having four or more rows are also contemplated. Each row is oriented parallel with the slow axis $A_S$ and perpendicular to the fast axis $A_F$ with the droplets in each row positioned a distance $d_S$ apart from one another, and further with droplets of any one row offset from droplets in adjacent rows in relation to the fast axis $A_F$. The distance $d_F$ between each row is at least equal to and more preferably greater than $d_S/n$ while the offset of droplets along axis $A_S$ relative to droplets of adjacent rows is equal to $d_S/n$. This approach increases the spatial uniformity of the distribution of liquid volume across the substrate surface when subjected to anisotropic spreading conditions imparted by a directionally-oriented template. The overall filling speed is thus improved by reducing the distance that each droplet will flow to fill the directional pattern features. The droplet spacing along the slow spread axis $A_S$ is thus largely determined by the diameter of the drop (DD) on the substrate surface. The average distance between droplet centers along the fast axis is then determined by the target density of droplets. The target density of droplets is determined by a number of factors, including the droplet volume, the volume requirements of the template pattern, and the desired thickness of residual layer (RLT). Thus, in certain variations the droplets can be arranged such that the distance between drop centers is further reduced along the slow spread direction ($A_S$), and the distance between drop centers is elongated along the rapid spread direction ($A_F$), such that $d_F$ is greater than $d_S$.

Figure 4A:
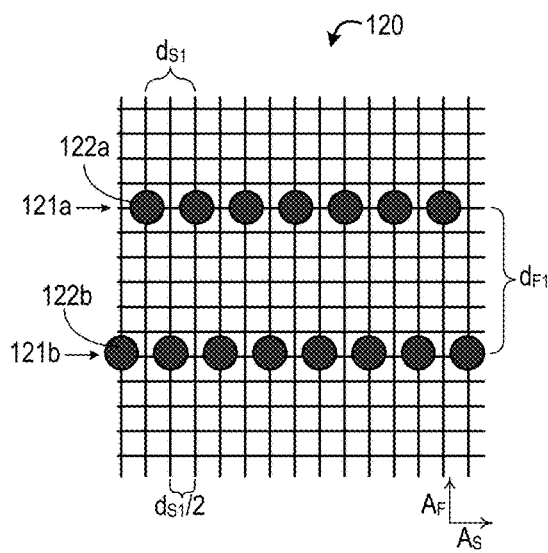
FIG. 4A illustrates an exemplary drop pattern deposited upon a substrate surface.
Figure 4B:
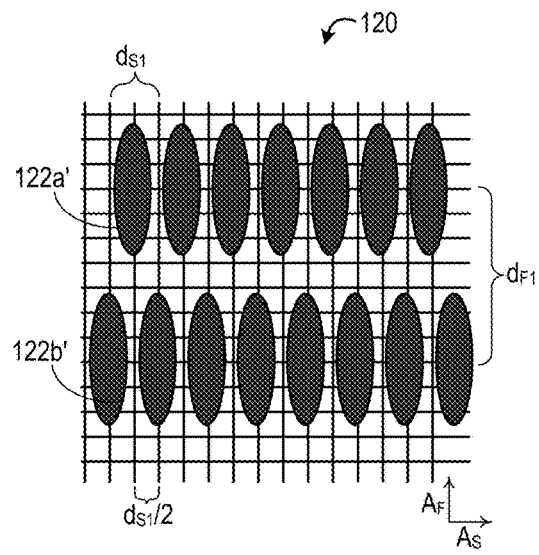
FIG. 4B illustrates the directional fluid spread of the drop pattern of FIG. 4A shortly after contact with a directionally-patterned template.

An example of a drop pattern according to the invention is depicted in FIG. 4A. With reference thereto, drop pattern 120 includes first row 121a of drops 122a and second row 121b of droplets 122b oriented parallel to slow axis $A_S$ with rows 121a and 121b separated distance $d_{F1}$ from each other relative to fast axis $A_F$. Droplets 122a and 122b, respectively, are spaced apart distance $d_{S1}$ from one other along each corresponding row 121a and 121b and are offset a distance $d_{S1}/2$ along the slow axis $A_S$ relative to corresponding droplets in adjacent rows (i.e., in relation to axis $A_S$, droplets 122b of row 121b are offset by distance $d_{S1}/2$ relative to the position of droplets 122a of row 121a). Here distance $d_F$ is greater than $d_S$ by a factor of 3:1. Upon contact with a directionally-patterned template with the elongated features such that axis $A_T$ of the template is aligned with fast axis $A_F$, the droplets spread in a directional fashion as illustrated in FIG. 4B with fluid spread occurring rapidly along axis $A_F$ and with slower spread along axis $A_S$, such that the bulk of fluid filling is accomplished along the fast axis $A_F$.

Figure 5A:
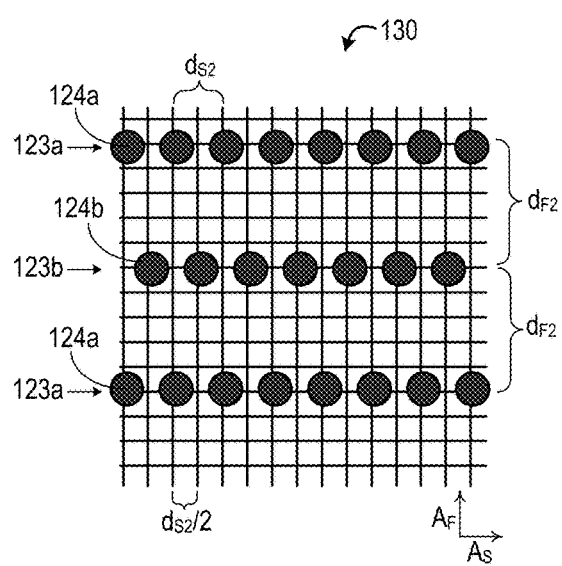
FIGS. 5A-5C illustrate exemplary drop patterns deposited upon a substrate surface.
Figure 5B:
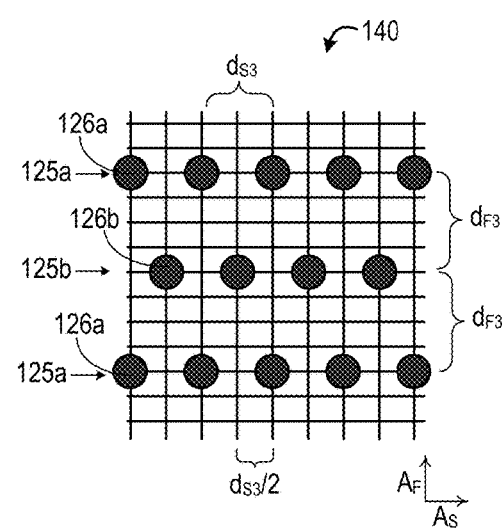
Figure 5C:
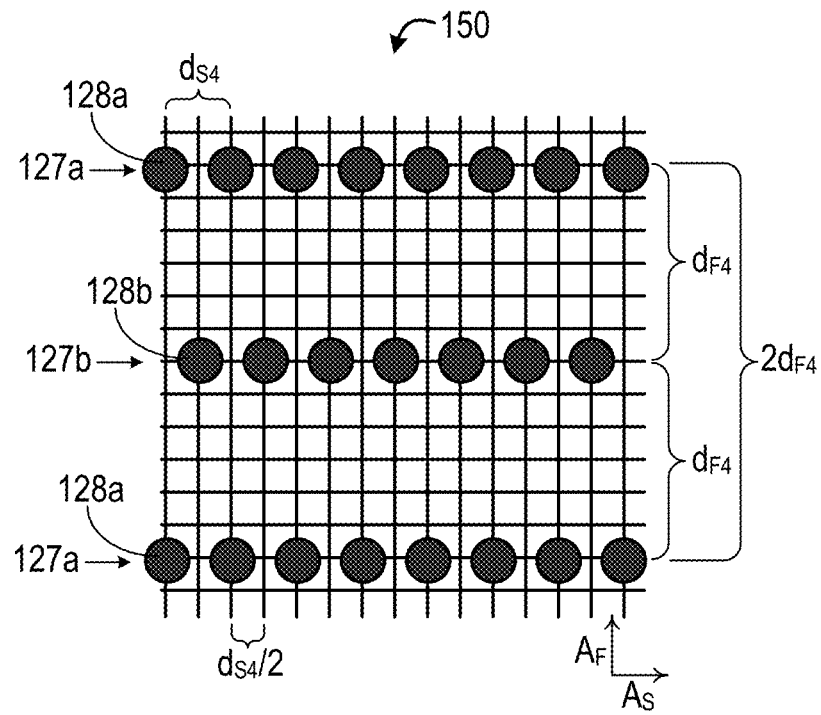

Additional exemplary patterns are depicted in FIGS. 5A, 5B and 5C which show variations on repeating two row patterns. Referring to FIG. 5A, drop pattern 130 includes repeating rows 123a and 123b containing droplets 124a and 124b, respectively, oriented parallel to slow axis $A_S$. The droplets 124a and 124b in each respective row are spaced apart distance $d_{S2}$ from each other with the adjacent rows 123a and 123b spaced distance $d_{F2}$ apart along the fast axis $A_F$. Droplets 124b of row 123b are offset a distance $d_{S2}$ along the slow axis $A_S$ relative to droplets 123a of rows 123a. Here the ratio $d_{F2}:d_{S2}$ is 5:2. Referring to FIG. 5B, drop pattern 140 is similar to drop pattern 130 and likewise including sets of two repeating rows 125a and 125b containing droplets 126a and 126b, respectively, with droplets spaced $d_{S3}$ apart, the rows spaced $d_{F3}$ apart, and the offset between droplets of adjacent rows $d_{S3}/2$. The ratio $d_{F3}:d_{S3}$ is smaller at 2:1 as compared to drop pattern 130, and further the grid pitch in the slow axis $A_S$ direction is greater than that in pattern 130, such that $d_{S3}$ of pattern 140 is greater than the distance $d_{S2}$ in pattern 130. Referring to FIG. 5C, pattern 150 is likewise similar to drop pattern 130 with sets of two repeating rows 127a and 127b containing droplets 128a and 128b, respectively. Here the droplets are spaced $d_{S4}$ apart and the adjacent rows are spaced $d_{F4}$ apart (such that the distance between the repeating set of rows is $2d_{F4}$). Again the $A_S$ offset between droplets of adjacent rows $d_{S4}/2$. Relative to pattern 130, here the ratio $d_{F4}:d_{S4}$ is greater at 3:1.

Figure 6:
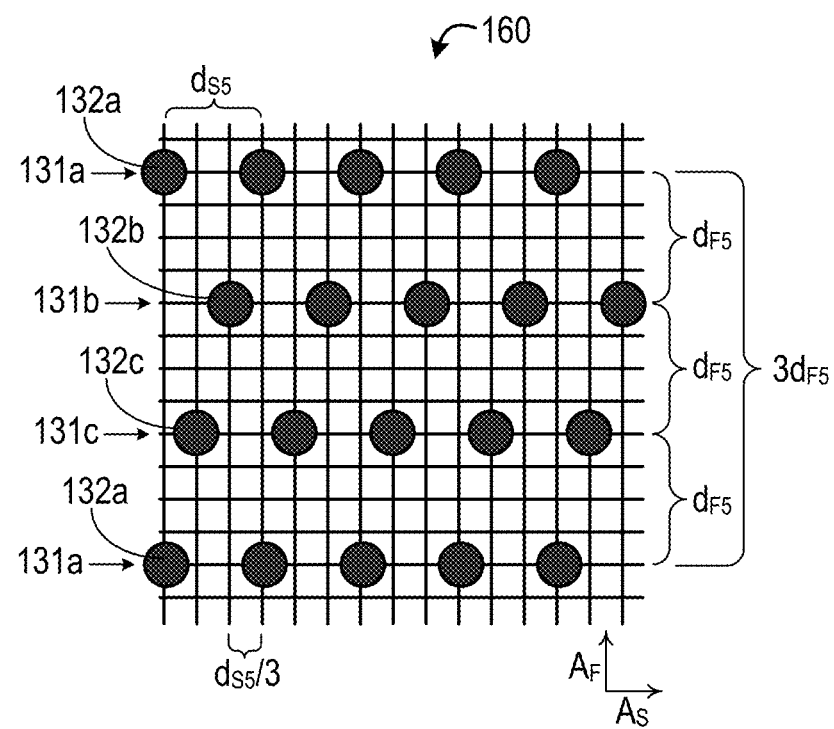
FIG. 6 illustrates an exemplary drop pattern deposited upon a substrate surface.

Referring to FIG. 6, drop pattern 160 includes three repeating rows 131a, 131b, and 131c oriented parallel to slow axis $A_S$, containing droplets 132a, 132b, and 132c, respectively. Each row is spaced a distance $d_{F5}$ apart from each adjacent row, such that the distance between repeating sets of rows 131a, 131b and 131c is $3d_{F5}$, and the droplets in each respective row are spaced apart a distance $d_{S5}$ from droplets in adjacent rows. In this instance, with the repeating set of rows containing three rows, the offset distance of droplets along the slow axis $A_S$ relative to the droplets of adjacent rows is $d_{S5}/3$.

Figure 3:
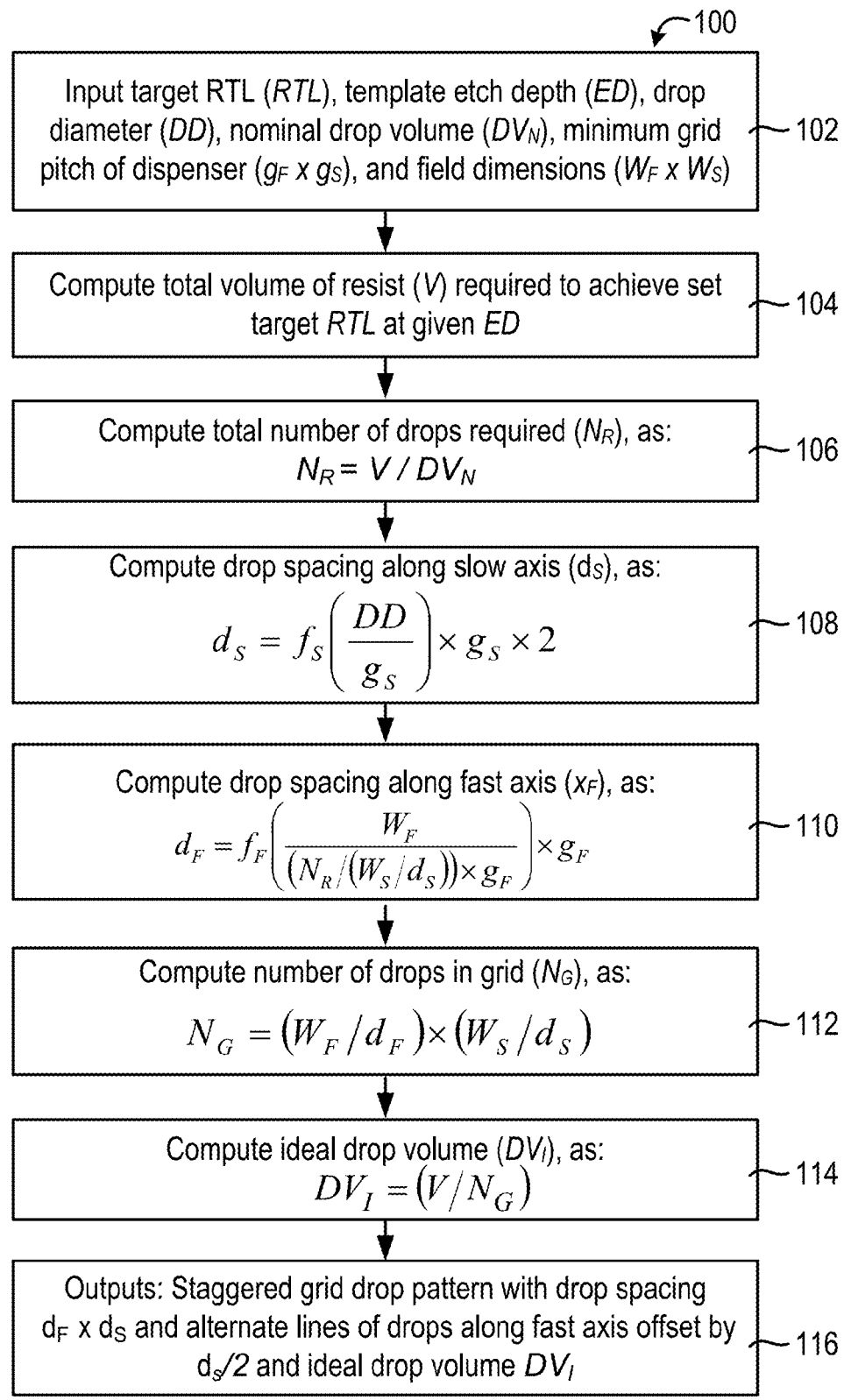
FIG. 3 illustrates flow chart of an exemplary method for generating a fluid drop pattern.

Referring now to FIG. 3, flow chart 100 provides for an exemplary method of generating a drop pattern for a directionally-patterned template according to the invention. Notably, the drop pattern provided by flow chart 100 consists of repeating sets of two offset rows. In step 102, specific inputs are provided relating to the template design and the dispense system parameters, including the target residual layer thickness (RLT) of the resultant patterned layer, the template etch depth (ED) (i.e., the depth to which the directional features are etched into the template patterning surface), the nominal drop volume (DVN) and drop diameter (DD) of the resist droplets when deposited onto the substrate surface, the minimum grid pitch of the dispenser (gF×gS), and the field dimensions (WF×WS) of the imprinted field. In step 104, the total volume (V) of resist required achieve the target RLT given the etch depth ED is then computed. In step 106 the total number of droplets required (NR) are then computed as:

$$N_R = V/DV_N$$

In steps 108 and 110, the droplet spacing along the fast axis and slow axis of the drop pattern is then computed. Again, the term "fast axis" and "slow axis" refers to perpendicular axes of the drop pattern where the "fast axis" or $A_F$ is oriented parallel to the template axis $A_T$, i.e., parallel with the elongated features of the template, and the "slow axis" or $A_S$ is the axis that is perpendicular to the fast axis, i.e., the axis that is oriented perpendicular to the elongated features of the template. It will be understood that variables denoting fast axis parameters have the subscript 'F', while variables denoting slow axis parameters have the subscript 'S'. For example, $g_S$ refers to the grid spacing along the slow axis $A_S$. Droplet spacing $d_S$ along the slow axis is computed as:

$$d_S = f_S\left(\frac{DD}{g_S}\right) \times g_S \times 2$$

The multiplier 2 here corresponds to the number of rows in the repeating sets of rows, which in this illustration is two. For repeating sets of greater than two rows, the multiplier will correspond to the number n of such rows.

Droplet spacing $d_F$ along the fast axis is computed as:

$$d_F = f_F\left(\frac{W_F}{(N_R/(W_S/d_S)) \times g_F}\right) \times g_F$$

In steps 112 and 114, ideal droplet volume, $DV_I$, is then determined. First in step 112 the number of droplets in a grid array, $N_G$, are computed as:

$$N_G = (W_F/d_F) \times (W_S/d_S)$$

From this calculation, the ideal droplet volume, $DV_I$ is then computed in step 114 as:

$$DV_I = (V/N_G)$$

In step 116, the above calculations of droplet spacing $d_F$ and $d_S$ and ideal droplet volume $DV_I$ are then used to generate the output drop pattern. The output drop pattern is an offset (or staggered) grid (i.e., x-y) pattern of droplets of droplet volume $DV_I$ and droplet spacing of $d_F \times d_S$ (i.e., $d_F$ by $d_S$) where the "x" axis of the grid corresponds to the slow axis ($A_S$) and the "y" axis corresponds to the fast axis ($A_F$). Alternate lines of droplets are staggered or offset by $d_S/2$ along the slow axis ($A_S$). As above with respect to the slow axis spacing, the divisor 2 here likewise corresponds to the number of rows in the repeating sets of rows, which again in this illustration is two. Thus for repeating sets greater than two rows, the divisor will correspond to the number n of such rows, i.e., $d_S/n$.

With reference to steps 108 and 110, the functions $f_S$ and/or $f_F$ are functions of both the dispenser and stage properties. However, the stage placement accuracy is typically an order of magnitude better than that of the dispenser. Hence $f_S$ and/or $f_F$ may safely be designed as functions of the grid spacing of the dispenser and the placement accuracy of the drops.

The function $f_S$ used to compute the spacing along the slow axis, $d_S$, should be chosen such that:

$$(f_S * g_S + \epsilon_S) \le DD$$

Where $g_S$ is the grid spacing along the slow axis, $\epsilon_S$ is the maximum drop placement error of the dispenser, and DD is the drop diameter. One example of such a function is:

$$f(a) = \text{floor}(a)$$

Where floor(a) is the largest integer not greater than a.

For anisotropic spreading conditions of varying degrees, function $f_S$ can be modified to account for changes in fluid transport capability along the slow axis. For instance, function $f_S$ used to compute the spacing along the slow axis, $x_S$, could be modified such that:

$$(f_S * g_S + \epsilon_S) \le DD * \lambda$$

Where $g_S$ is the grid spacing along the slow axis, $\epsilon_S$ is the maximum drop placement error of the dispenser, and DD is the drop diameter, and $\lambda$ is a factor determined experimentally or from modeling of drop spreading behavior. For highly anisotropic spreading, $\lambda \le 1$. For cases where spreading is less anisotropic, $\lambda > 1$. As $\lambda$ increases, drop spacing along the slow axis increases, subsequently resulting in a decreased spacing along the fast axis.

An additional consideration in designing the drop patterns provided herein is the advantage of providing overlapping drop boundaries between nearest neighbor droplets along the fast axis $A_F$ as a means for minimizing the requirement for fluid transport along the slow axis $A_S$. The need to have overlapping drop boundaries along the fast axis becomes increasingly important as drop spreading behavior becomes highly anisotropic. For templates with continuous gratings, or uninterrupted lines and spaces, drop spreading is highly anisotropic, therefore drop overlap can aid in eliminating the development of slow filling channel voids. A margin of error for drop placement accuracy by the dispense system should also be incorporated, since the fill time penalty for creating a channel void is high.

Figure 7A:
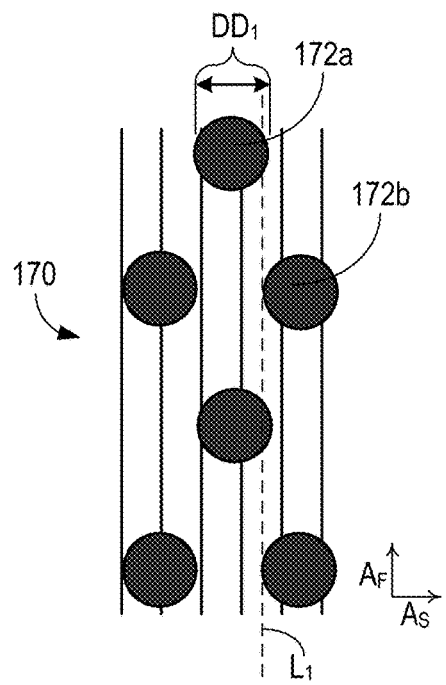
FIGS. 7A-7C illustrate exemplary drop patterns deposited upon a substrate surface, with varying droplet diameters and spacings.
Figure 7B:
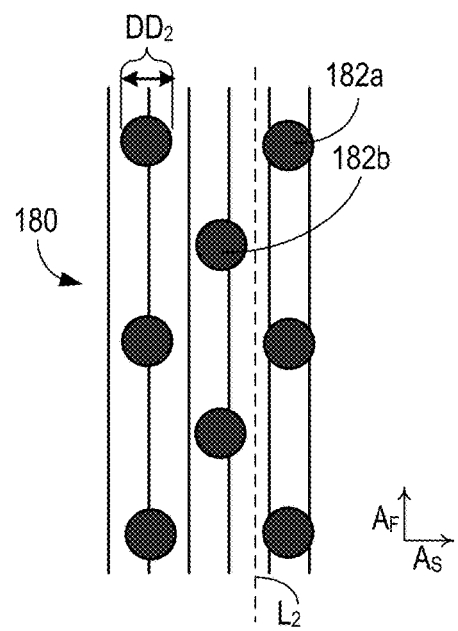
Figure 7C:
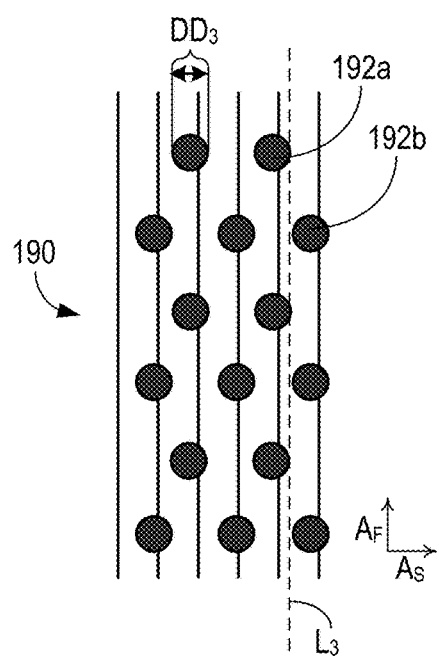

With reference to FIGS. 7A-7C, three drop patterns are depicted in which the same RLT is produced by adjusting drop volume and pitch. In pattern 170 of FIG. 7A, droplets 172a and 172b have diameters $DD_1$ that overlap along line $L_1$ along the fast axis $A_F$, therefore a slow filing channel void will not form along line $L_1$. In pattern 180 of FIG. 7B, droplets 182a and 182b have a smaller diameter $DD_2$, and thus necessarily contain a smaller drop volume relative to droplets 172a and 172b of pattern 170. Droplets 182a and 182b are therefore packed closer together along the fast-axis in order to maintain the same RLT. However the droplet diameters do not overlap between nearest neighbor droplets along axis $A_F$. Thus, a slow-to-fill channel void will develop along line $L_2$. In pattern 190 of FIG. 7C, the droplet diameter (and hence volume) is reduced such that droplets 192a and droplets 192b are packed even closer together on both slow and fast axes $A_S$ and $A_F$ in order to maintain the same resultant RLT, but in this case, there is overlap between nearest neighbor droplets along line $L_3$ aligned with fast-axis $A_F$. Here, no slow-to-fill, channel voids will form and the closer droplet spacing as compared to pattern 170 further helps reduce the filling time. In order to achieve such overlap, the distances $d_S$ the droplets are spaced along the slow axis $A_S$ should be such that $d_S$ is less than n times the diameter (DD) of the droplets, where n is the number of rows in the repeating set of rows. In the examples of FIGS. 7A and 7C, which represent a two-row scenario, this distance will be less than twice DD.

EXAMPLES

Comparative experiments (Examples 1-3 below) were performed using a non-uniform, non-periodic drop pattern, a square grid drop pattern, and a drop pattern according to the invention herein. In each experiment, an imprint process was performed using an imprint lithography template having patterned surface consisting of gratings having 32 nm lines and spaces at a 1:1 pitch. In each experiment, the imprint was performed using the UV curable resin MonoMat®, available from Molecular Imprints, Inc. (Austin, Tex.) as the polymerizable material and deposited as droplets onto a silicon wafer spin-coated with an adhesive layer (TranSpin® adhesive, available from Molecular Imprints, Inc.). Upon contact with the template, microscopic inspection was performed and the elapsed time for fluid spread and template feature fill was observed.

Example 1

Non-Uniform Pattern

A non-uniform, non-periodic drop pattern was generated according to the methods described in U.S. Pat. No. 8,119,052. Upon initial contact with the template, the non-uniform, non-periodic drop pattern (not shown) yielded fluid spreading having a distribution of non-filled spaces or voids of varying shapes and sizes, and the final fill times of the voids were observed. The fastest filling void filled in 1.5 seconds with the slowest filling void taking approximately 5 seconds to fill.

Example 2

Square Grid Pattern

A square grid drop pattern was deposited in a manner as above, as shown in the image of FIG. 8A, and elapsed time for filling again monitored. Here the deposited droplets had diameters of 107 µm (nominal). The distance between droplets along each row ($A_S$ direction) was 211.25 µm and the distance between rows ($A_F$ direction) was likewise 211.25 µm with no offset between droplets of adjacent rows. The images of FIGS. 8B-8C show to extent of filling at 0.1 second, 1 second, and 7 seconds after template contact, respectively. The image taken 0.1 s after template contact (FIG. 8B) shows the fluid merging between nearest neighbor droplets along the direction of the grating, or fast axis ($A_F$). One-second after contact (FIG. 8C), more than 70% of the area was filled, while the unfilled area is comprised of channel-like voids. At 7 seconds (FIG. 8D), only a small fraction of the area remains unfilled; however, another 8 seconds were required to produce a continuous film i.e. a contiguous layer of the polymerizable material (final filled image not shown).

Example 3

Drop Pattern Designed for Directional Template

A drop pattern produced according to the methods described above was deposited on the substrate in the manner above, the drop pattern consisting of repeating sets of two rows, with an offset between adjacent rows as depicted in the image of FIG. 9A. Here the deposited droplets had diameters of 90 µm (nominal). The distance between droplets along each row ($A_S$ direction) was 169 µm and the distance between rows ($A_F$ direction) was 211.25 µm. Here the number of repeating rows per set, n, is 2. The offset was 169/n, with n=2, or 84.5 µm. The image of FIG. 9B shows initial contact with the template; the image of FIG. 9C is at 1 second after contact. The last void disappeared 1.3 seconds after the template contacted the drops in the field of view (image not shown). The result of the new drop pattern design was a drastic improvement in filling speed. In FIG. 10, which is an enlarged view of FIG. 9B, arrows placed along drop boundaries indicate the position of opposing fluid fronts before they merge. Thus fill time in this example was approximately 4× faster than non-uniform, non-periodic pattern of Example 1 and almost 12× faster than the square grid pattern of Example 2.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An imprint lithography method for forming a patterned layer on a substrate, the method comprising:
   providing an imprint lithography template, the imprint lithography template having a patterning surface at least a portion thereof having repeating elongated features directionally oriented parallel to an axis $A_T$ of the template;
   depositing a plurality of spaced-apart droplets of polymerizable material in a pattern onto a substrate, the pattern comprising a grid array oriented along perpendicular axes $A_s$ and $A_F$ and having a plurality of repeating rows of deposited droplets, each deposited droplet having a diameter DD, with each row oriented parallel to the axis $A_s$ and perpendicular to the axis $A_F$, wherein the droplets within each row are positioned a first distance $d_S$ apart from each other, and wherein each row of the plurality of rows is positioned a second distance $d_F$ apart from each adjacent row, wherein a magnitude of the second distance $d_F$ that each row is positioned apart from the adjacent row is a function of the number of rows of deposited droplets of the grid array and the first distance $d_s$ that the droplets in each row are positioned apart from each other, and wherein the positions of deposited droplets in any one row are offset along the axis $A_S$ relative to the positions of deposited droplets in adjacent rows based on the number of rows of deposited droplets of the grid array and the first distance $d_s$ that the droplets in each row are positioned apart from each other;

positioning the template in superimposition with the deposited pattern of droplets such that the axis $A_T$ of the template is oriented parallel to the axis $A_F$ of the deposited pattern of droplets;

contacting the template with the deposited polymerizable material to facilitate spreading of the polymerizable material and formation of a contiguous layer of polymerizable material conforming to the template patterning surface;

solidifying the polymerizable material to form a patterned layer on the substrate; and separating the template from the formed patterned layer.

2. The method of claim 1 wherein $d_F$ is greater than $d_S$.

3. The method of claim 1 wherein the plurality of rows of droplets further comprises repeating sets of first and second rows and wherein the droplets in the second rows are offset relative to those in adjacent rows a distance equal to one-half of the first distance $d_S$.

4. The method of claim 1 wherein the plurality of rows of droplets further comprises repeating sets of first, second and third rows, wherein the droplets in the second rows are offset relative to those in the first rows a distance equal to one-third of the first distance $d_S$ and wherein the droplets in the third rows are offset relative to those in the first rows a distance equal to two-thirds of the first distance $d_S$.

5. The method of claim 1 wherein the first distance $d_S$ is less than the number of rows of deposited droplets of the grid array times the diameter DD.

6. The method of claim 1 wherein the elongated features of the template are gratings.

7. The method of claim 1 further comprising:

providing a fluid dispenser for depositing the pattern of droplets of polymerizable material onto the substrate, the fluid dispenser further having a minimum grid pitch $g_F$ by $g_S$ corresponding to the axes $A_F$ and $A_S$, respectively, and a drop placement error of $\epsilon_S$ relative to the axis $A_s$, and determining the first distance $d_S$ based on the diameter DD, the grid pitch $g_S$, and the number of rows of deposited droplets of the grid array.

8. The method of claim 7 wherein the patterning surface corresponds to a field, the field having dimensions $W_F$ by $W_S$ associated with the axes $A_F$ and $A_S$, respectively, and further comprising the steps of:

determining the etch depth (ED) of the template;

providing a desired residual layer thickness (RLT) for the patterned layer;

determining the total volume (V) of polymerizable material required to form a patterned layer based on the etch depth (ED) and the desired residual layer thickness (RLT);

providing a nominal drop volume ($DV_N$) for each deposited droplet of polymerizable material;

determining the total number of droplets $N_R$ to be dispensed based on the nominal drop volume ($DV_N$) as:

$N_R = V/DV_N$ and; determining the second distance $d_F$ based on the dimension $W_F$, the dimension $W_S$, the total number of droplets $N_R$, the first distance $d_S$, and the grid pitch $g_F$.

9. The method of claim 8 further comprising:

determining the total number drops $N_G$ to be actually deposited in the grid array as:

$N_G = (W_F/d_F) \times (W_S/d_S)$ and determining the actual drop volume ($DV_I$) of each drop to be actually deposited in the grid array as:

$DV_I = (V/N_G)$.

10. The method of claim 1, wherein the second distance $d_F$ is greater than a ratio of the first distance $d_s$ and the number of rows of deposited droplets of the grid array.

11. The method of claim 1, wherein the positions of deposited droplets in any one row are offset along the axis $A_S$ equal to a ratio of the first distance $d_s$ and the number of rows of deposited droplets of the grid array.

12. An imprint lithography method for forming a patterned layer on a substrate, the method comprising:

providing an imprint lithography template, the imprint lithography template having a patterning surface at least a portion thereof having repeating elongated features directionally oriented parallel to an axis $A_T$ of the template;

depositing a plurality of spaced-apart droplets of polymerizable material in a pattern onto a substrate, the pattern comprising a grid array oriented along perpendicular axes $A_s$ and $A_F$ and having a plurality of repeating rows of deposited droplets, each deposited droplet having a diameter DD, with each row oriented parallel to the axis $A_s$ and perpendicular to the axis $A_F$, wherein the droplets within each row are positioned a first distance $d_S$ apart from each other, and wherein each row of the plurality of rows is positioned a second distance $d_F$ apart from each adjacent row, wherein a magnitude of the second distance $d_F$ that each row positioned apart from the adjacent row is a function of the number of rows n of deposited droplets of the grid array and the first distance $d_s$ that the droplets in each row are positioned apart from each other, and wherein the positions of deposited droplets in any one row are offset along the axis $A_S$ relative to the positions of deposited droplets in adjacent rows based on the number of rows of deposited droplets of the grid array and the first distance $d_s$ that the droplets in each row are positioned apart from each other, and wherein the first distance $d_S$ is less than n times the droplet diameter DD;

positioning the template in superimposition with the deposited pattern of droplets such that the axis $A_T$ of the template is oriented parallel to the axis $A_F$ of the deposited pattern of droplets;

contacting the template with the deposited polymerizable material to facilitate spreading of the polymerizable material and formation of a contiguous layer of polymerizable material conforming to the template patterning surface;

solidifying the polymerizable material to form a patterned layer on the substrate; and separating the template from the formed patterned layer.

13. The method of claim 12 wherein the plurality of rows of droplets further comprises repeating sets of first and second rows and wherein the droplets in the second rows are offset relative to those in adjacent rows a distance equal to one-half of the first distance $d_S$.

14. The method of claim 12 wherein the plurality of rows of droplets further comprises repeating sets of first, second and third rows, wherein the droplets in the second rows are offset relative to those in the first rows a distance equal to one-third of the first distance $d_S$ and wherein the droplets in the third rows are offset relative to those in the first rows a distance equal to two-thirds of the first distance $d_S$.

15. The method of claim 12 wherein the elongated features of the template are gratings.

16. The method of claim 12 further comprising:
providing a fluid dispenser for depositing the pattern of droplets of polymerizable material onto the substrate, the fluid dispenser further having a minimum grid pitch $g_F$ by $g_S$ corresponding to the axes $A_F$ and $A_S$, respectively, and a drop placement error of $\epsilon_S$ relative to the axis $A_s$, and determining the first distance $d_S$ based on the diameter DD, the grid pitch $g_S$, and the number of rows n.

17. The method of claim 16 wherein the patterning surface corresponds to a field, the field having dimensions $W_F$ by $W_S$ associated with the axes $A_F$ and $A_S$, respectively, and further comprising the steps of:

determining the etch depth (ED) of the template;
providing a desired residual layer thickness (RLT) for the patterned layer;
determining the total volume (V) of polymerizable material required to form a patterned layer based on the etch depth (ED) and the desired residual layer thickness (RLT);
providing a nominal drop volume ($DV_N$) for each deposited droplet of polymerizable material;
determining the total number of droplets $N_R$ to be dispensed based on the nominal drop volume ($DV_N$) as:

$$N_R = V/DV_N$$

and;

determining the second distance $d_F$ based on the dimension $W_F$, the dimension $W_S$, the total number of droplets $N_R$, the first distance $d_S$, and the grid pitch $g_F$.

18. The method of claim 17 further comprising:
determining the total number drops $N_G$ to be actually deposited in the grid array as:

$$N_G = (W_F/d_F) \times (W_S/d_S)$$

and determining the actual drop volume ($DV_I$) of each drop to be actually deposited in the grid array as:

$$DV_I = (V/N_G).$$

19. An imprint lithography method for forming a patterned layer on a substrate, the method comprising:
providing an imprint lithography template, the imprint lithography template having a patterning surface at least a portion thereof having gratings directionally oriented parallel to an axis $A_T$ of the template;

providing a fluid dispenser for depositing the pattern of droplets of polymerizable material onto the substrate, the fluid dispenser further having a minimum grid pitch $g_F$ by $g_S$ corresponding to perpendicular axes $A_F$ and $A_S$, respectively, and a drop placement error of $\epsilon_S$ relative to axis $A_S$, depositing via the fluid dispenser a plurality of spaced-apart droplets of polymerizable material in a pattern onto a substrate, the pattern comprising a grid array oriented along the perpendicular axes $A_S$ and $A_F$ and having a plurality of repeating rows of deposited droplets, each deposited droplet having a diameter DD, with each row oriented parallel to axis the $A_s$ and perpendicular to the axis $A_F$, wherein the droplets within each row are positioned a first distance $d_S$ apart from each other, and wherein each row of the plurality of rows is positioned a second distance $d_F$ apart from each adjacent row, wherein a magnitude of the second distance $d_F$ that each row is positioned apart from the adjacent row is a function of the number of rows n of deposited droplets of the grid array and the first distance $d_s$ that the droplets in each row are positioned apart from each other, wherein the positions of deposited droplets in any one row are offset along the axis $A_S$ relative to the positions of deposited droplets in adjacent rows based on the number of rows of deposited droplets of the grid array and the first distance $d_s$ that the droplets in each row are positioned apart from each other, and wherein the first distance $d_S$ is less than n times the droplet diameter DD, and further wherein the first distance $d_S$ is based on the diameter DD, the grid pitch $g_S$, and the number of rows n;

positioning the template in superimposition with the deposited pattern of droplets such that the axis $A_T$ of the template is oriented parallel to the axis $A_F$ of the deposited pattern of droplets;

contacting the template with the deposited polymerizable material to facilitate spreading of the polymerizable material and formation of a contiguous layer of polymerizable material conforming to the template patterning surface;

solidifying the polymerizable material to form a patterned layer on the substrate; and separating the template from the formed patterned layer.

* * * * *